US012021519B1

(12) United States Patent
Wang et al.

(10) Patent No.: US 12,021,519 B1
(45) Date of Patent: Jun. 25, 2024

(54) HIGH-POWER REPEAT-FREQUENCY SOLID-STATE SWITCH CONTROLLED BY COMBINATION OF OPTICAL AMPLIFICATION AND ELECTRICAL AMPLIFICATION, AND METHOD

(71) Applicant: Institute of Fluid Physics, China Academy of Engineering Physics, Mianyang (CN)

(72) Inventors: Lingyun Wang, Mianyang (CN); Jianqiang Yuan, Mianyang (CN); Hongwei Liu, Mianyang (CN); Weiping Xie, Mianyang (CN); Chongbiao Luan, Mianyang (CN); Ping Jiang, Mianyang (CN); Hongtao Li, Mianyang (CN)

(73) Assignee: Institute of Fluid Physics, China Academy of Engineering Physics, Mianyang (CN)

( * ) Notice: Subject to any disclaimer, the term of this patent is extended or adjusted under 35 U.S.C. 154(b) by 0 days.

(21) Appl. No.: 18/435,942

(22) Filed: Feb. 7, 2024

Related U.S. Application Data (63) Continuation of application No. PCT/CN2022/135813, filed on Dec. 1, 2022.

(30) Foreign Application Priority Data

Jun. 30, 2022 (CN) .......................... 202210754299.4

(51) Int. Cl.
*H03K 17/78* (2006.01)
(52) U.S. Cl.
CPC .................................. *H03K 17/78* (2013.01)

(58) Field of Classification Search
CPC ......... H01L 31/08; H01L 31/09; H01L 31/16; H03K 17/78; H03K 17/51
See application file for complete search history.

(56) References Cited

U.S. PATENT DOCUMENTS 5,291,056 A * 3/1994 Howson ................ H01L 31/162
257/E31.093
5,811,841 A * 9/1998 Ganguly .................. H01L 31/08
257/431

(Continued)

FOREIGN PATENT DOCUMENTS

CN 103545703 A 1/2014
CN 207801884 U 8/2018

(Continued)

OTHER PUBLICATIONS

First Office Action issued in counterpart Chinese Patent Application No. 202210754299.4, dated Aug. 5, 2022.

(Continued)

*Primary Examiner* — John R Lee
(74) *Attorney, Agent, or Firm* — Westbridge IP LLC (57) ABSTRACT

Disclosed are a high-power repeat-frequency solid-state switch controlled by a combination of an optical amplification and an electrical amplification, and a method. The switch includes an optical pulse unit, an optical amplification device, an optical coupling device and a photoelectric semiconductor structure; the photoelectric semiconductor structure takes a photoelectric effect material as a base, and a multi-layer doping structure is manufactured on the photoelectric effect material; the optical pulse unit is configured to output an optical pulse signal to the optical amplification device; the optical amplification device is configured to amplify the optical pulse signal; the optical coupling device is configured to shape and diffuse the amplified optical pulse signal to form an array optical pulse signal; and irradiated by (Continued)

the optical pulse signal, the photoelectric effect material generates photo-induced carriers subjected to a photo-induced linear model amplification and/or a field-induced nonlinear model amplification in the multi-layer doping structure.

9 Claims, 7 Drawing Sheets

(56) References Cited

U.S. PATENT DOCUMENTS

| | | | | |
|---|---|---|---|---|
| 7,173,295 | B1* | 2/2007 | Mar | H01L 31/125 |
| | | | | 257/466 |
| 9,147,789 | B2* | 9/2015 | Sartorius | H01L 31/1844 |
| 10,403,780 | B2* | 9/2019 | Jang | H01L 31/1075 |
| 2009/0261258 | A1* | 10/2009 | Harris | H03C 1/34 |
| | | | | 250/370.01 |
| 2014/0284451 | A1 | 9/2014 | Sampayan et al. | |
| 2022/0123211 | A1 | 4/2022 | Voss et al. | |
| 2022/0320360 | A1* | 10/2022 | DeJarld | H01L 31/03044 |
| 2023/0070932 | A1* | 3/2023 | Merrett | H01L 31/1136 |
| 2024/0097064 | A1* | 3/2024 | Koehler | H01L 31/102 |

FOREIGN PATENT DOCUMENTS

| | | |
|---|---|---|
| CN | 111082792 A | 4/2020 |
| CN | 111739953 A | 10/2020 |
| CN | 113488560 A | 10/2021 |
| CN | 114826233 A | 7/2022 |

OTHER PUBLICATIONS

Grant Notification issued in counterpart Chinese Patent Application No. 202210754299.4, dated Aug. 29, 2022.

Majda-Zdancewicz et al., Current state of photoconductive semiconductor switch engineering, Opto-Electronics Review, 2018, 26(2), pp. 92-102, dated Mar. 8, 2018.

Wang, Research on the driving technology of photoconductive switches based on semiconductor lasers, Master's Thesis submitted to China Academy of Engineering Physics, dated Feb. 15, 2014.

* cited by examiner

HIGH-POWER REPEAT-FREQUENCY SOLID-STATE SWITCH CONTROLLED BY COMBINATION OF OPTICAL AMPLIFICATION AND ELECTRICAL AMPLIFICATION, AND METHOD

CROSS-REFERENCE TO RELATED APPLICATIONS

This application is a continuation of International Application No. PCT/CN2022/135813, filed on Dec. 1, 2022, which claims priority to Chinese Patent Application No. 202210754299.4, filed on Jun. 30, 2022. All of the aforementioned applications are incorporated herein by reference in their entireties.

TECHNICAL FIELD

The present disclosure belongs to the technical field of high-power semiconductor switches, and in particular to a high-power repeat-frequency solid-state switch controlled by a combination of an optical amplification and an electrical amplification, and a method.

BACKGROUND

Only gas-type switches such as hydrogen thyratron, pseudospark switches and gas switches with high voltage, large current, fast conduction speed, high charge transfer and capability of delaying time accurately at the same time are available in the existing high-power switch technology, but these switches cannot achieve maintenance-free use due to limited service life; and moreover the gas-type switches have the self-breakdown probability because of the working mechanism factor, that is, a situation of accidental self-breakdown conduction may occur.

In the existing power semiconductor switch technology, the switch device cannot have the high voltage, large current, fast conduction speed, high charge transfer and capability of delaying time accurately at the same time. Currently, the relatively common power semiconductor switch device includes IGBT (Insulated-gate Bipolar Transistor), MOSFET (Metal-Oxide-Semiconductor Field Effect Transistor), MCT (MOS-Controlled Thyristor) and SGTO (Super Gate Turn Off Thyristor), which have the current change rate (di/dt) reaching hundreds of kiloamperes per microsecond (kA/μs) when the peak power of tens of megawatts (MW) is hard to be achieved at the same time.

However, gallium arsenide and silicon carbide photoconductive semiconductor switch cannot achieve the high charge transfer and the like, the current is also limited and generally difficult to break through 10 kA, causing that a pulse width is limited within the hundred ns magnitude. A silicon photoconductive semiconductor switch may support a broad pulse width, but is difficult to withstand long-term loading of DC (Direct Current) voltage.

SUMMARY

To overcome the limitation existing in the current switch technology, the present disclosure provides a high-power repeat-frequency solid-state switch controlled by a combination of an optical amplification and an electrical amplification. In the present disclosure, the power of a switch device is amplified and alternated for several times by adopting a control mode combining the optical amplification with the electrical amplification, and finally the high-power amplification is achieved, such that the switch device obtains the advantages of high voltage, large current, fast conduction speed, high charge transfer and delaying time accurately.

The present disclosure is implemented by the following technical solution.

A high-power repeat-frequency solid-state switch controlled by a combination of an optical amplification and an electrical amplification, including an optical pulse unit, an optical amplification device, an optical coupling device and a photoelectric semiconductor structure;

the photoelectric semiconductor structure takes a photoelectric effect material as a base, a multi-layer doping structure is manufactured on the photoelectric effect material to form a plurality of PNP structures and a plurality of NPN structures, and both the PNP structures and the NPN structures are not provided with electrically contacted base electrodes;

the optical pulse unit is configured to output an optical pulse signal to the optical amplification device;

the optical amplification device is configured to amplify the optical pulse signal;

the optical coupling device is configured to shape and diffuse the amplified optical pulse signal to form an array optical pulse signal, which is output to the photoelectric semiconductor structure; and the photoelectric effect material generates photo-induced carriers under the irradiation of the optical pulse signal, and the photo-induced carriers are subjected to a photo-induced linear model amplification and/or a field-induced nonlinear model amplification in the multi-layer doping structure, to achieve the high-power amplification and conduction.

Compared with the existing switch device, the novel switch device proposed by the present disclosure adopts the control mode combining the optical amplification with the electrical amplification, overcomes the limitation existing in the current switch device, and has the characteristics of high voltage, large current, fast conduction speed, high charge transfer and delaying time accurately, with a wide range of application.

As a preferred implementation, the optical pulse unit in the present disclosure includes a pulse power supply and an electro-optical conversion device; and the pulse power supply is configured to convert a power supply into a high-power supply; and the electro-optical conversion device converts the high-power supply into the optical pulse signal.

As a preferred implementation, the pulse power supply in the present disclosure is a laser power supply.

As a preferred implementation, the electro-optical conversion device in the present disclosure is a gas medium device or a solid medium device.

As a preferred implementation, the electro-optical conversion device in the present disclosure is a xenon lamp or a laser diode.

As a preferred implementation, the optical amplification device in the present disclosure is an optical amplification crystal or an optical amplification fiber.

As a preferred implementation, the optical coupling device in the present disclosure is a diffractive optical light-splitting element, an optical lens or an array fiber bundle.

As a preferred implementation, the photoelectric effect material in the present disclosure is silicon, gallium arsenide, silicon carbide or gallium nitride.

According to a second aspect, the present disclosure proposes a working method based on the above high-power repeat-frequency solid-state switch, and the method includes the following steps of:

converting a power supply into an optical pulse signal for output;

amplifying the optical pulse signal;

shaping and diffusing the amplified optical pulse signal to form an array optical pulse signal;

irradiating the array optical pulse signal into a photoelectric effect material, to generate photo-induced carriers; and the photo-induced carriers being subjected to a photo-induced linear model amplification and/or a field-induced nonlinear model amplification in a multi-layer doping structure, to achieve the high-power amplification and conduction.

As a preferred implementation, the photo-induced carriers in the present disclosure being subjected to the photo-induced linear model amplification and/or the field-induced nonlinear model amplification in the multi-layer doping structure specifically includes:

performing a photo-induced linear model amplification conduction in an initial conduction stage of the switch;

performing a mixed amplification conduction of the photo-induced linear model and the field-induced nonlinear model in a medium conduction stage of the switch;

performing a field-induced nonlinear model amplification conduction in a later conduction stage of the switch;

the photo-induced linear model amplification conduction being that the array optical pulse signal directly irradiates an N area of each PNP structure and a P area of each NPN structure, to conduct a quick amplification conduction in a corresponding region; and the field-induced nonlinear model amplification conduction being that an established positive feedback mechanism diffuses and conducts quickly under the effect of an electric field.

The present disclosure has the following advantages and beneficial effects:

The high-power repeat-frequency solid-state switch provided by the present disclosure is a novel switch device for generating a high-power pulse, and can obtain the pulse output with high voltage, large current, fast leading edge and high repetition frequency.

The high-power repeat-frequency solid-state switch device provided by the present disclosure has a working voltage capable of reaching 0-30 kV, a working current capable of reaching 0-200 kV, a current change rate (di/dt) exceeding 400 kA/µs, and a repetition frequency capable of reaching 0-10 KHz.

The high-power repeat-frequency solid-state switch device provided by the present disclosure is especially suitable for generating the pulse power with large current and fast leading edge, and can replace the gas switch, a gas trigger tube, a hydrogen thyratron, the pseudospark switch, and serially connected MOSFET, FID (Fast Ionization Dynistor), SOS (Save Our Souls), PCSS (Photoconductive Semiconductor Switch), etc.

BRIEF DESCRIPTION OF THE DRAWINGS

The drawings illustrated herein are used for providing a further understanding of embodiments of the present invention, and constitute a part of this application, but do not constitute limitations to the embodiments of the present invention.

DETAILED DESCRIPTION OF THE EMBODIMENTS

In the text below, terms "comprise" or "may comprise" used in various embodiments of the present disclosure indicates a function of the present disclosure, an operation or existence of a component, and does not limit the addition of one or more functions, the operation and the component. In addition, terms "comprise", "have" and their cognate words used in various embodiments of the present disclosure are merely intended to indicate a specific characteristic, a figure, a step, an operation, a component, an assembly or a combination of the above items, and shall not be understood as the existence of firstly eliminating one or more other characteristics, the figure, the step, the operation, the component, the assembly or the combination of the above items or a possibility of adding one or more other characteristics, the figure, the step, the operation, the component, the assembly or the combination of the above items.

In various embodiments of the present disclosure, the expression "or" or "at least one A or/and B" includes any combination or all combinations of characters listed at the same time. For example, the expression "A or B" or "at least one of A or/and B" may include A, B or A and B.

The expressions (such as "first", "second" and the like) used in various embodiments of the present disclosure may modify various components in various embodiments, instead of limiting the corresponding components. For example, the above expressions are not intended to limit the sequence and/or significance of the above components. The above expressions are merely used for the purpose of distinguishing one component from other components. For example, a first user device and a second user device are configured to indicate different user devices, although both are user devices. For example, without deviating from the scope of various embodiments of the present disclosure, the first component can be called as the second component, and similarly, the second component can also be called as the first component.

It is noted that if one constituent component is "connected" to another constituent component in the description, the first constituent component is directly connected to the second constituent component, and a third constituent component is "connected" between the first constituent component and the second constituent component. On the contrary, when one constituent component is "directly connected" to another constituent component, it is understood that the third constituent component does not exist between the first constituent component and the second constituent component.

Terms used in various embodiments of the present disclosure are only for the purpose of describing specific embodiments and not intended to limit various embodiments of the present disclosure. As used herein, singular forms are also intended to include the plural forms, unless otherwise specified in the context. Unless otherwise defined, all terms (including technical terms and scientific terms) used here have the same meaning as the general understanding of those of ordinary skill in the art. The terms (such as terms defined in commonly used dictionaries) will be explained as the meaning that is the same as that in the context of the related technical art, and not explained as the idealized meaning or the formal meaning, unless it is clearly defined in various embodiments of the present disclosure.

In order to enable the purpose, the technical solution and the advantage of the present invention to be more clear, the present invention is further described in detail below in combination with the embodiments and the drawings. The exemplary examples of the present invention and the description thereof are used for explaining the present invention, but do not constitute improper limitations to the present invention.

Embodiment 1

To solve the limitation existing in the current switch device, for example, the gas switch device has the shortcomings of insufficient repetition frequency, low reliability, short service life and the like, the power semiconductor switch device has the shortcoming of slow conduction speed, and the photoconductive semiconductor switch device has the shortcomings of low current, low charge transfer and the like. This embodiment provides a high-power repeat-frequency solid-state switch controlled by a combination of an optical amplification and an electrical amplification, which adopts a control mode combining the optical amplification with the electrical amplification, such that the power of a device is amplified and alternated for several times, and finally the high-power amplification is achieved, so the switch device obtains the advantages of high voltage, large current, fast conduction speed, high charge transfer and delaying time accurately.

Figure 1:
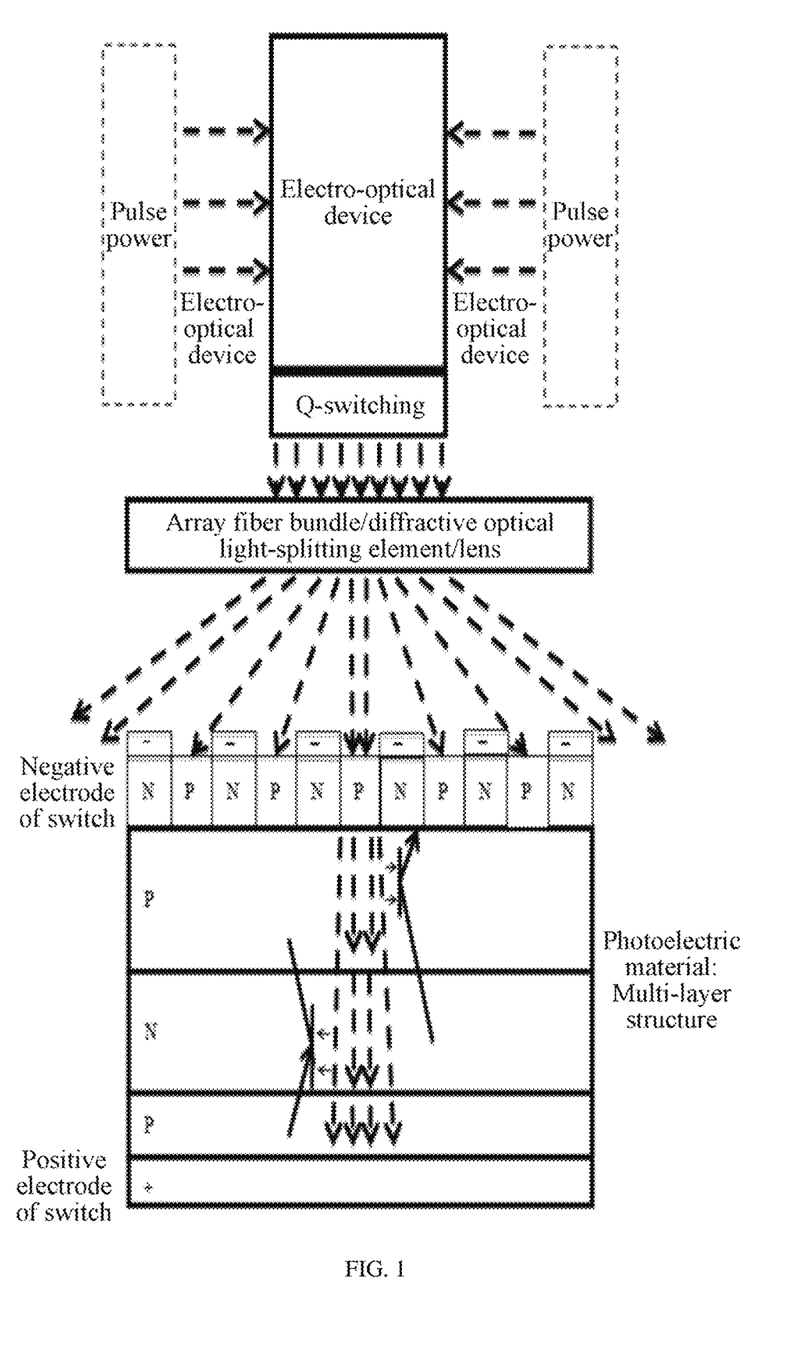
FIG. 1 is a functional block diagram of a switch in embodiments of the present disclosure.

As shown in FIG. 1, the high-power repeat-frequency solid-state switch in this embodiment includes a pulse power supply, an electro-optical conversion device, an optical amplification device, an optical coupling device and a photoelectric semiconductor structure.

The pulse power supply is configured to provide a high-power supply. The pulse power supply may be a high-voltage pre-burning power supply or a constant-current low-voltage power supply or a laser power supply and the like, and the power supply is converted into a higher power, to achieve the amplification for the initial electric power. The illustration in embodiments of the present disclosure takes the laser power supply as an example, but is not limited.

The electro-optical conversion device is configured to convert the initial electric power output by the pulse power supply into an optical pulse signal. The electro-optical conversion device may be a gas medium device or a solid medium device and the like, such as a xenon lamp and a laser diode, and the initial electric power is converted into light, usually a high-energy optical pulse.

The optical amplification device is configured to amplify the optical pulse signal output by the electro-optical conversion device. The optical amplification device may be an optical amplification crystal or an optical amplification fiber and the like; and after being compressed and amplified, the optical pulse signal is output in an active or passive Q-switching manner. The illustration in embodiments of the present disclosure is described by taking the optical amplification crystal as an example, but is not limited.

The optical coupling device shapes or directly and naturally diffuses the optical pulse signal output by the optical amplification device to form a specific light spot pattern, generally diffuses into a plurality of light spots, and a great-area of light spot array is formed and output in form of space coupling or fiber coupling. The optical coupling device may be an array fiber bundle, a diffractive optical light-splitting element, a lens and the like.

The photoelectric semiconductor structure is a poly-cell multi-gate structure, a base thereof is the photoelectric effect material which may be a silicon material, or gallium arsenide, silicon carbide, gallium nitride and other materials, the array optical pulse output by the optical coupling device irradiates the photoelectric effect material, generates photo-induced carriers in a great area and multiple junction depths in a plurality of photoelectric effect regions, and has a certain concentration, to achieve the direct photo-induced linear amplification conduction model.

A multi-layer doping structure is manufactured on the photoelectric effect material to form a plurality of NPN structures and a plurality of PNP structures, which may also be called P-N-P-N structures. The difference from the traditional power semiconductor device is that both the NPN structures and the PNP structures in the multi-layer doping structure have no electrically contacted base electrodes. The array optical pulse signal output by the optical coupling device can directly irradiate a P area and an N area of each NPN structure and each PNP structure and is directly and quickly amplified in the corresponding region, and this process may be described as the photo-induced linear amplification conduction model; when the optical pulse disappears gradually, the photo-induced carriers and the established positive feedback mechanism act together under the effect of an extra electric field such that the device maintains conduction and the photo-induced carriers diffuse further; and when the optical pulse disappears completely and carriers directly produced by the light disappear, the established positive feedback mechanism enables the carriers to be transported in the surrounding region under the effect of the electric field, to form the great-area complete conduction and amplify for maintenance, the conduction resistance is further reduced, and this process may be described as the field-induced nonlinear amplification conduction model. The whole process experiences the early photo-induced linear amplification conduction model, the late field-induced nonlinear amplification conduction model and the medium mixed amplification conduction model.

Figure 2:
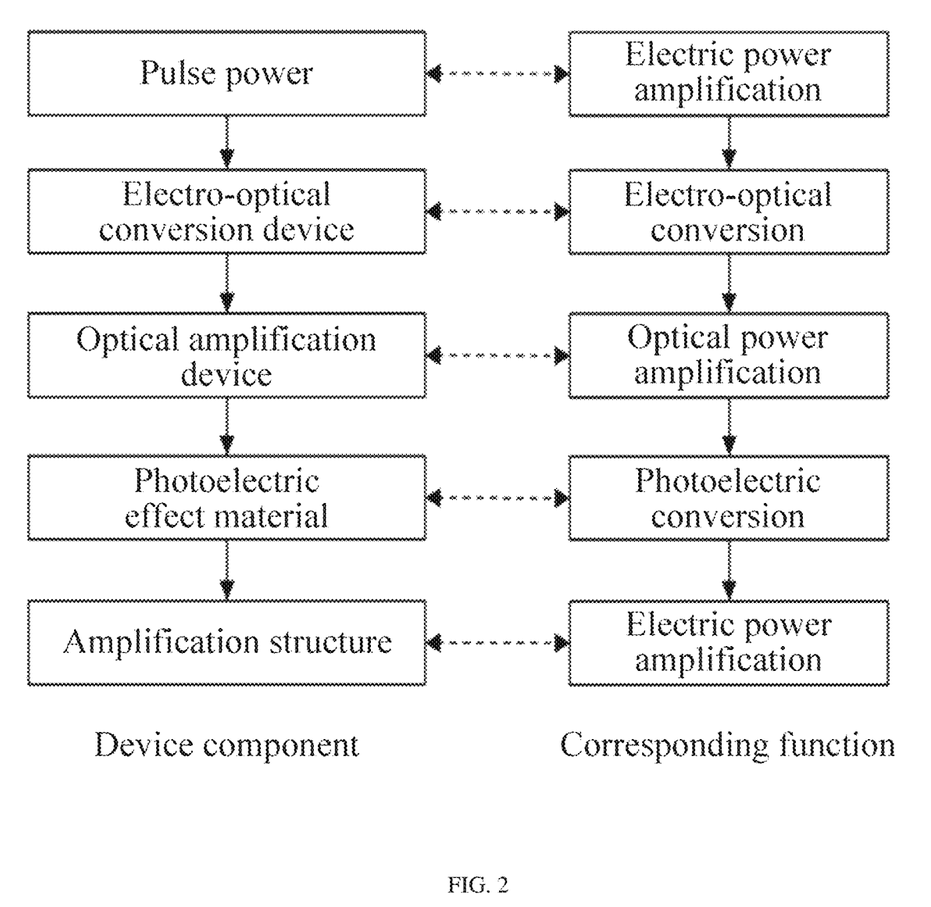
FIG. 2 is a workflow diagram of a switch in embodiments of the present disclosure.

As shown in FIG. 2, the working process of the high-power repeat-frequency solid-state switch in this embodiment is specifically as follows:

the power supply is converted into a high-voltage and large-current pulse;

the electric power is converted into the optical pulse signal through the electro-optical conversion device;

the optical pulse signal is amplified in the optical amplification device, to generate amplified optical power;

the amplified light is coupled and output by the optical coupling device, irradiates the photoelectric effect material and generates photo-induced carriers with a relatively high initial concentration, and the optical power is converted into the electric power; and the photo-induced carriers are subjected to the photo-induced linear amplification conduction model and/or field-induced nonlinear amplification conduction model in the P-N-P-N structure, to obtain the higher electric power.

The high-power repeat-frequency solid-state switch in this embodiment can achieve a brand-new working mechanism:

Photo-induced linear amplification conduction model in the initial stage of the switch conduction and the stage of high current change rate (di/dt): the optical pulse directly irradiates the photoelectric effect material based on the previous optical amplification, to generate a quick photoelectric effect, form a great number of uniformly distributed photo-induced carriers and enter the photo-induced linear amplification conduction model.

Field-induced nonlinear model in the late stage of the switch conduction and the large-current continuous conduction stage: based on the distribution of the existing photo-induced carriers, diffuse and multiply quickly under the effect of the high electric field, to be uniformly conducted in a great area and enter the field-induced nonlinear amplification conduction model.

In the medium stage of the switch conduction, the photo-induced linear amplification conduction model and the field-induced nonlinear amplification conduction model act together, such that the switch has a higher power amplification.

Compared with the existing switch device, the high-power repeat-frequency solid-state switch proposed by this embodiment of the present disclosure has the characteristics shown in Table 1.

ment of the present disclosure not only has the advantages of the photoconductive semiconductor switch in aspects of optoelectronic isolation, speediness and the like, but also has the advantages of the SGTO switch in aspects of high charge transfer, large current and the like, therefore the high-power repeat-frequency solid-state switch may be used for partially replacing the traditional gas thyratron well in an accelerator, partially replacing the gas switch in a pulse power device, partially replacing the photoconductive semiconductor switch and the like in the field of special power, replacing the traditional MOSFET serial switch in a Pockels Cell of a laser device, and the high-power switch requiring large-current change rate (di/dt) for electromagnetic emission, electromagnetic welding and the like, etc.

Embodiment 2

Figure 3:
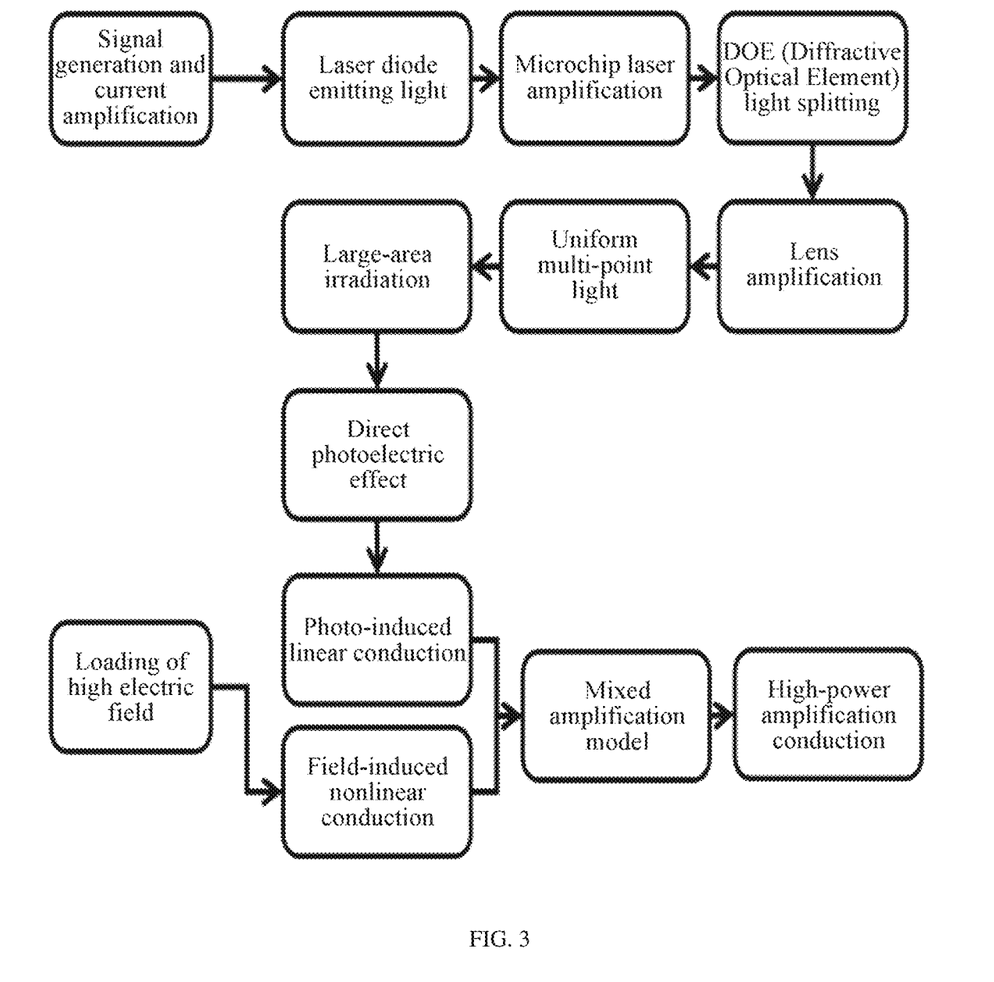
FIG. 3 is a workflow example I of a switch in embodiments of the present disclosure.

As shown in FIG. 3, the working process of the high-power repeat-frequency solid-state switch proposed by the above embodiment 1 is described in this embodiment by taking the laser diode, microchip amplification device and DOE (Diffractive Optical Element) +lens as examples:

The amplified electric power is input into the laser diode, to promote the laser diode to output the laser pulse signal;

after being amplified by the microchip amplification device, the laser pulse signal is subjected to light splitting through the DOE device, and then amplified by the lens to form the uniform multi-point light (or array light) for output; and the multi-point light irradiates the photoelectric semiconductor structure directly in a great area, the direct and quick photoelectric effect can generate the photo-induced carriers with relatively high initial concentration in the photoelectric effect material, and the switch device enters the initial conduction state, that is, the

TABLE 1

| Advantages/characteristics | Large-current change rate | High repetition frequency | Long service life | Large current | High voltage | High charge transfer | Accurate delay time | Resistance to strong electromagnetic interference |
|---|---|---|---|---|---|---|---|---|
| Novel switch device proposed by this embodiment of the present disclosure | + | + | + | + | + | + | + | + |
| IGBT | + | + | + | + | + | + | − | − |
| MOSFET | + | + | + | − | − | + | + | + |
| MCT | + | − | + | + | + | + | + | − |
| SGTO | + | − | + | + | + | + | + | − |
| Photoconductive semiconductor switch | + | + | + | − | + | − | + | + |
| Gas switch | + | − | − | + | + | − | + | + |
| Hydrogen thyratron | + | + | − | + | + | − | + | + |
| Pseudospark switch | + | + | − | + | + | − | + | + |
| Gas trigger tube | + | − | − | + | + | − | − | + |

Note: In Table 1, "+" indicates that the characteristic is available, and "−" indicates that the characteristic is unavailable or limited.

It can be known from Table 1 that the high-power repeat-frequency solid-state switch proposed by the embodiphoto-induced linear amplification conduction model; as the optical pulse disappears gradually and the photo-induced carriers and the established positive feedback mechanism act together under the loading of the electric field, making the device maintain the conduction, the photo-induced carriers diffuse further, the switch device enters the medium conduction state, which is the common effect of the photo-induced linear amplification conduction and the field-induced nonlinear amplification conduction, that is, the mixed amplification conduction model; and when the optical pulse disappears completely and carriers directly produced by the light disappear, the established positive feedback mechanism enables the carriers to be transported in the surrounding region under the effect of the electric field, to form the great-area complete conduction, and the switch enters the late conduction state, that is, the field-induced nonlinear amplification conduction state.

Embodiment 3

Figure 4:
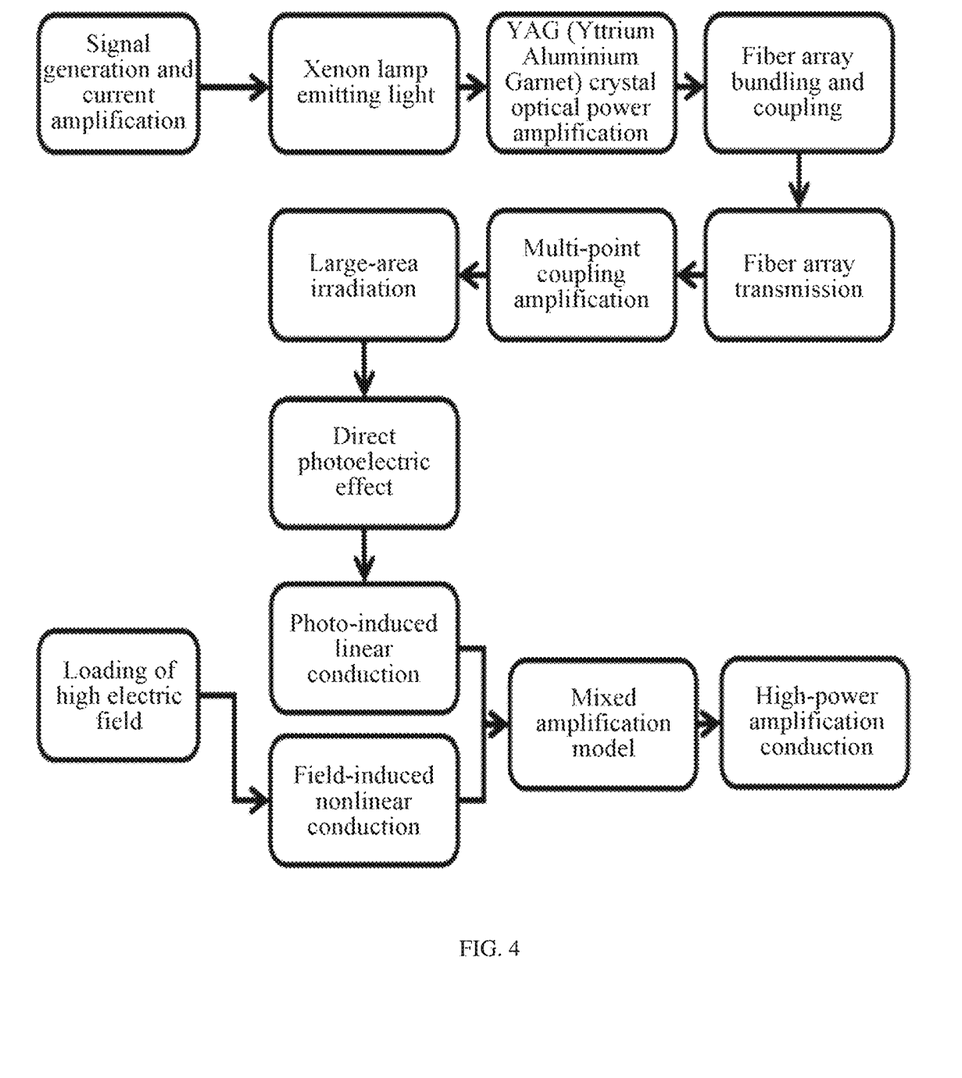
FIG. 4 is a workflow example II of a switch in embodiments of the present disclosure.

As shown in FIG. 4, the working process of the high-power repeat-frequency solid-state switch proposed by the above embodiment 1 is described in this embodiment by taking the xenon lamp, YAG (Yttrium Aluminium Garnet) crystal amplification device and fiber array as examples:

The amplified electric power is input into the xenon lamp, to promote the xenon lamp to output the laser pulse signal;
 after being amplified by the YAG crystal amplification device and subjected to the light splitting by the fiber array, the laser pulse signal is subjected to multi-point coupling amplification for output; and
 the multi-point light irradiates the photoelectric semiconductor structure directly in a great area, the direct and quick photoelectric effect can generate the photo-induced carriers with relatively high initial concentration in the photoelectric effect material, and the switch device enters the initial conduction state, that is, the photo-induced linear amplification conduction model; as the optical pulse disappears gradually and the photo-induced carriers and the established positive feedback mechanism act together under the loading of the electric field, making the device maintain the conduction, the photo-induced carriers diffuse further, the switch device enters the medium conduction state, which is the common effect of the photo-induced linear amplification conduction and the field-induced nonlinear amplification conduction, that is, the mixed amplification conduction model; and when the optical pulse disappears completely and carriers directly produced by the light disappear, the established positive feedback mechanism enables the carriers to be transported in the surrounding region under the effect of the electric field, to form the great-area complete conduction, and the switch enters the late conduction state, that is, the field-induced nonlinear amplification conduction state.

Embodiment 4

Figure 5:
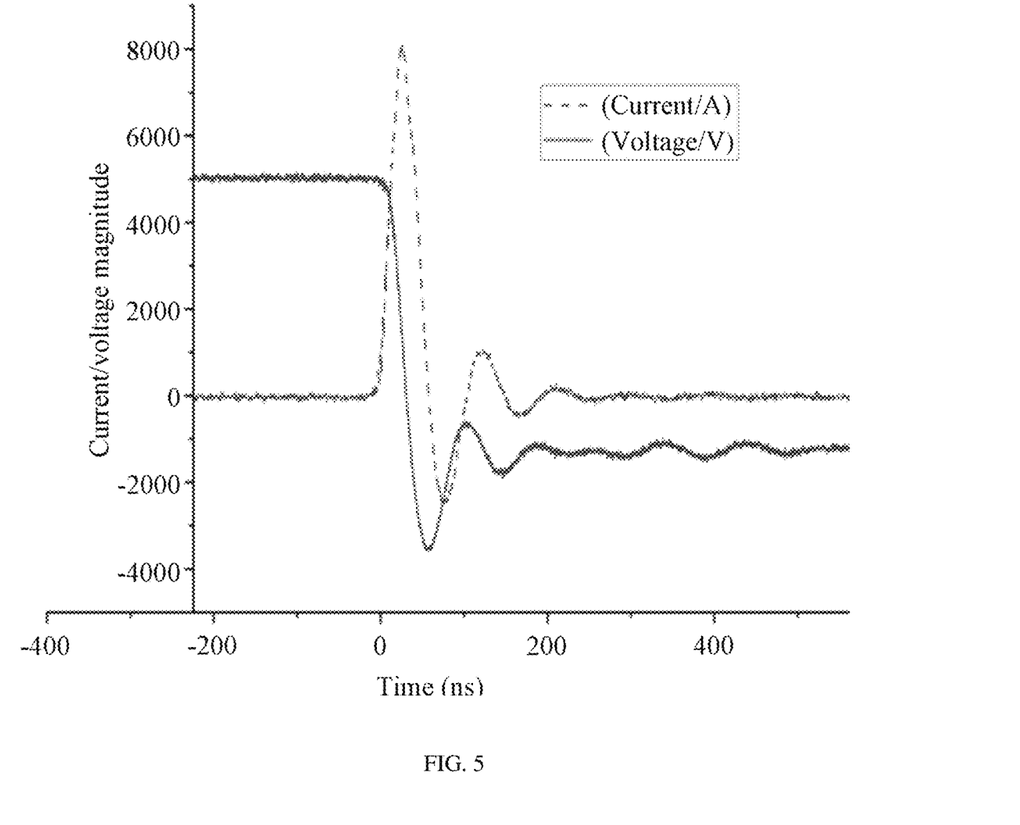
FIG. 5 is a testing effect diagram of a switch example I in embodiments of the present disclosure.
Figure 6:
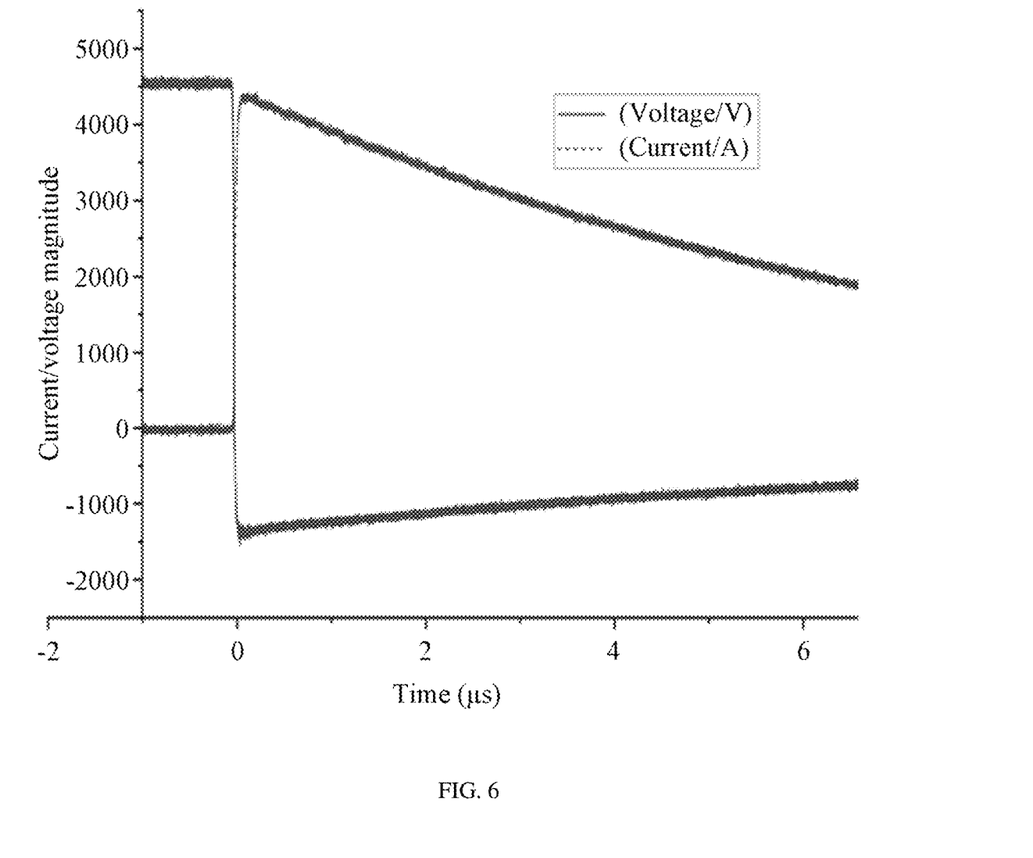
FIG. 6 is a testing effect diagram of a switch example II in embodiments of the present disclosure.
Figure 7:
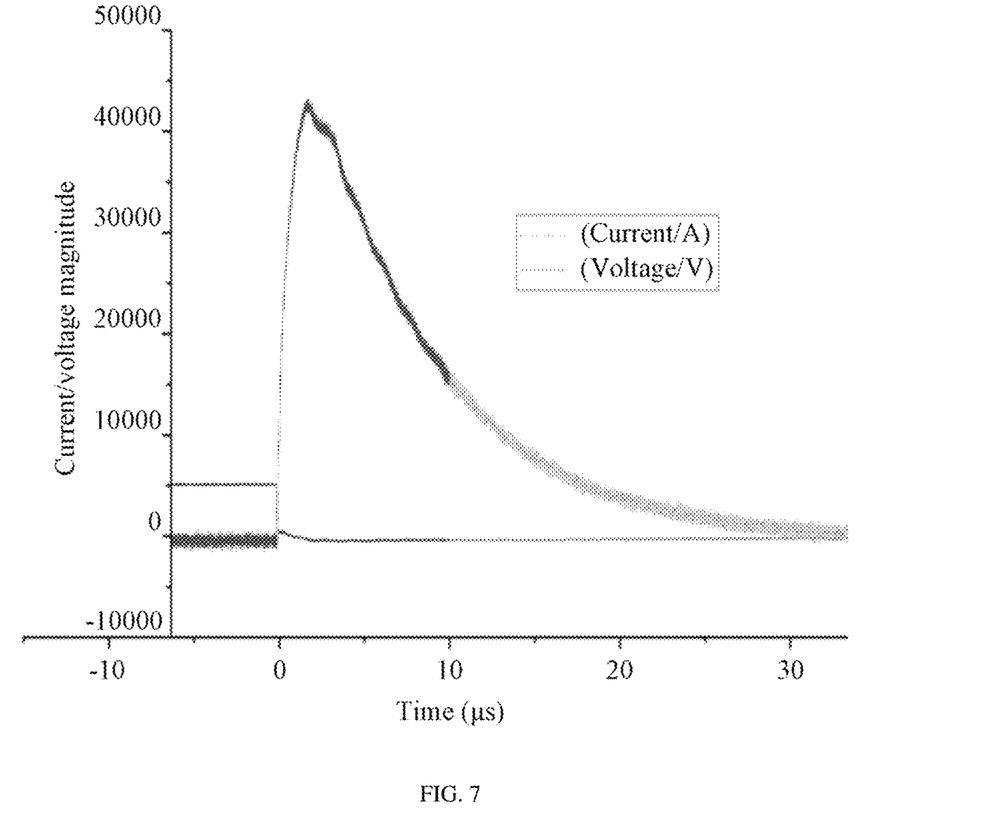
FIG. 7 is a testing effect diagram of a switch example III in embodiments of the present disclosure.

The high-power repeat-frequency solid-state switch proposed by the above embodiment 1 is tested in this embodiment, and the typical parameter test results thereof are as shown in FIG. 5-FIG. 7.

What is shown in FIG. 5 is the testing result of the high-power repeat-frequency solid-state switch with the photoelectric semiconductor structure diameter of 12 mm, where the dotted line is the electrically amplified current waveform (cathode testing), with the unit of A; the solid line is the switch loaded voltage waveform (anode testing), with the unit of V; and the abscissa is the time, with the unit of ns. It can be known from the figure that: the high-power repeat-frequency solid-state switch in this embodiment adopts the typical parameters for testing on the structure with a diameter of 12 mm to acquire about 8 kA current, 18 ns current leading edge (including loop inductance, etc.), an output current change rate (di/dt) reaching 400 kA/μs or above and a single device peak power greater than 40 MW (as shown in FIG. 5, if the peak current is about 8.11 kA and the peak voltage is about 5.15 kV, the peak power is about 41.77 MW).

What is shown in FIG. 6 is the testing result of the high-power repeat-frequency solid-state switch with the photoelectric semiconductor structure diameter of 12 mm in another example, where the dotted line is the electrically amplified current waveform (cathode testing), with the unit of A; the solid line is the switch loaded voltage waveform (cathode testing), with the unit of V; and the abscissa is the time, with the unit of μs. It can be known from the figure that: the high-power repeat-frequency solid-state switch in this embodiment adopts the typical parameters for testing on the structure with a diameter of 12 mm to acquire about 4.43 kA current, 36.7 ns current leading edge, an output current change rate (di/dt) reaching 120 kA/μs or above (limited by the testing loop), a peak power reaching 20 MW or above (as shown in FIG. 6, if the peak current is about 4.43 kA and the peak voltage is about 4.65 kV, the peak power is about 20.60 MW), and a pulse width of 5 μs.

What is shown in FIG. 7 is the testing result of the high-power repeat-frequency solid-state switch with the photoelectric semiconductor structure diameter of 38 mm, where the dotted line is the electrically amplified current waveform (cathode testing), with the unit of A; the solid line is the switch loaded voltage waveform (anode testing), with the unit of V; and the abscissa is the time, with the unit of μs. It can be known from the figure that: the high-power repeat-frequency solid-state switch in this embodiment adopts the typical parameters for testing on the structure with a diameter of 38 mm to acquire about 43 kA current, 1.12 us current leading edge, an output current change rate (di/dt) reaching 38 kA/μs or above (limited by the testing loop), a peak power reaching 200 MW or above (as shown in FIG. 7, if the peak current is about 43.4 kA and the peak voltage is about 5.11 kV, the peak power is about 221.77 MW), and a pulse width of 16 μs.

The purpose, the technical solution and the beneficial effects of the present disclosure are further described in detail through the specific implementation modes above. It should be understood that the above is only optional embodiments of the present disclosure and not intended to limit the protective scope of the present disclosure. Any modifications, equivalent replacements, improvements and the like made within the spirit and principle of the present disclosure shall fall within the protective scope of the present disclosure.

What is claimed is:

1. A high-power repeat-frequency solid-state switch controlled by a combination of an optical amplification and an electrical amplification, comprising an optical pulse unit, an optical amplification device, an optical coupling device and a photoelectric semiconductor structure;
  wherein the photoelectric semiconductor structure takes a photoelectric effect material as a base, a multi-layer doping structure is manufactured on the photoelectric effect material to form a plurality of PNP structures and a plurality of NPN structures, and both the PNP structures and the NPN structures are not provided with electrically contacted base electrodes;
  the optical pulse unit is configured to output an optical pulse signal to the optical amplification device;

the optical amplification device is configured to amplify the optical pulse signal;

the optical coupling device is configured to shape and diffuse the amplified optical pulse signal to form an array optical pulse signal, which is output to the photoelectric semiconductor structure;

the photoelectric effect material generates photo-induced carriers under the irradiation of the optical pulse signal, and the photo-induced carriers are subjected to a photo-induced linear model amplification and/or a field-induced nonlinear model amplification in the multi-layer doping structure, to achieve the high-power amplification and conduction;

the photo-induced carriers being subjected to the photo-induced linear model amplification and/or the field-induced nonlinear model amplification in the multi-layer doping structure specifically comprises:

performing a photo-induced linear model amplification conduction in an initial conduction stage of the switch;

performing a mixed amplification conduction of the photo-induced linear model and the field-induced nonlinear model in a medium conduction stage of the switch;

performing a field-induced nonlinear model amplification conduction in a later conduction stage of the switch;

the photo-induced linear model amplification conduction being that the array optical pulse signal directly irradiates an N area of each PNP structure and a P area of each NPN structure, to conduct a quick amplification conduction in a corresponding region; and the field-induced nonlinear model amplification conduction being that an established positive feedback mechanism diffuses and conducts quickly under the effect of an electric field.

2. The high-power repeat-frequency solid-state switch controlled by the combination of the optical amplification and the electrical amplification according to claim 1, wherein the optical pulse unit comprises a pulse power supply and an electro-optical conversion device;

the pulse power supply is configured to convert a power supply into a high-power supply; and the electro-optical conversion device converts the high-power supply into the optical pulse signal.

3. The high-power repeat-frequency solid-state switch controlled by the combination of the optical amplification and the electrical amplification according to claim 2, wherein the pulse power supply is a laser power supply.

4. The high-power repeat-frequency solid-state switch controlled by the combination of the optical amplification and the electrical amplification according to claim 2, wherein the electro-optical conversion device is a gas medium device or a solid medium device.

5. The high-power repeat-frequency solid-state switch controlled by the combination of the optical amplification and the electrical amplification according to claim 2, wherein the electro-optical conversion device is a xenon lamp or a laser diode.

6. The high-power repeat-frequency solid-state switch controlled by the combination of the optical amplification and the electrical amplification according to claim 1, wherein the optical amplification device is an optical amplification crystal or an optical amplification fiber.

7. The high-power repeat-frequency solid-state switch controlled by the combination of the optical amplification and the electrical amplification according to claim 1, wherein the optical coupling device is a diffractive optical light-splitting element, an optical lens or an array fiber bundle.

8. The high-power repeat-frequency solid-state switch controlled by the combination of the optical amplification and the electrical amplification according to claim 1, wherein the photoelectric effect material is silicon, gallium arsenide, silicon carbide or gallium nitride.

9. A working method based on the high-power repeat-frequency solid-state switch controlled by the combination of the optical amplification and the electrical amplification according to claim 1, wherein the method comprises the following steps of:

converting a power supply into an optical pulse signal for output;

amplifying the optical pulse signal;

shaping and diffusing the amplified optical pulse signal to form an array optical pulse signal;

irradiating the array optical pulse signal into a photoelectric effect material, to generate photo-induced carriers; and the photo-induced carriers being subjected to a photo-induced linear model amplification and/or a field-induced nonlinear model amplification in a multi-layer doping structure, to achieve high-power amplification and conduction.

* * * * *